United States Patent [19]

Uekusa et al.

[11] 3,806,779

[45] Apr. 23, 1974

[54] SEMICONDUCTOR DEVICE AND METHOD OF MAKING SAME

[75] Inventors: Genzo Uekusa, Osaka; Shigeru Tanimura, Kyoto; Kazuhiro Higashi, Osaka; Takao Sumoto, Kyoto, all of Japan

[73] Assignee: Omron Tateisi Electronics Co., Kyoto, Japan

[22] Filed: Apr. 19, 1973

[21] Appl. No.: 352,663

Related U.S. Application Data

[63] Continuation of Ser. No. 76,800, Sept. 30, 1970, abandoned.

[30] Foreign Application Priority Data

Oct. 2, 1969 Japan ................................ 44-79099

[52] U.S. Cl. ...... 317/235 R, 317/235 N, 317/235 P, 317/235 UA

[51] Int. Cl. ............................................ H01l 15/00

[58] Field of Search ............................. 317/234, 235

[56] References Cited

UNITED STATES PATENTS

| | | | |
|---|---|---|---|
| 3,533,850 | 10/1970 | Tarneja et al. | 136/89 |
| 3,443,170 | 5/1969 | Pulvari | 317/234 |
| 3,560,809 | 2/1971 | Terakado | 317/234 |
| 3,567,508 | 3/1971 | Cox et al. | 117/212 |
| 3,523,223 | 8/1970 | Luxem et al. | 317/234 |

OTHER PUBLICATIONS

Japanese Jour. Applied Physics. Vol. 6, p. 905, 1967.

*Primary Examiner*—Rudolph V. Rolinec
*Assistant Examiner*—E. Wojciechowicz
*Attorney, Agent, or Firm*—Staas, Halsey & Gable

[57] ABSTRACT

A semiconductor composite having a rectifying characteristic is provided by first forming a film of electrically insulating material such as silicon dioxide on a main surface of a semiconductor substrate so as to have a portion of said surface exposed through an opening defined by said insulating material film and then depositing a tin oxide film on at least the open area of the semiconductor substrate. A barrier formed between the substrate and the tin oxide film and exhibiting the said rectifying characteristics is confined and protected by said insulating material film.

In manufacturing this semiconductor composite it is preferred to make such processing as scribing of the composite, photo-etching of the tin oxide film, etc. at a region where said insulating material film is formed, thereby eliminating damage to the barrier which might be caused by such processing if it had been done at the barrier area.

9 Claims, 10 Drawing Figures

INVENTORS
GENZO UEKUSA
SHIGERU TANIMURA
KAZUSHIRO HIGASHI
TAKAO SUMOTO

BY
Brufsky, Staas, Breiner & Halsey
ATTORNEYS

SEMICONDUCTOR DEVICE AND METHOD OF MAKING SAME

This is a continuation of application Ser. No. 76,800, filed Sept. 30, 1970, now abandoned.

BACKGROUND OF THE INVENTION

1. Field of the Invention

The present invention relates to a semiconductor device and a method of making the same. More specifically, the present invention relates to a semiconductor composite comprising a tin oxide film deposited on a semiconductor substrate and having a rectifying characteristic, and a process for manufacturing such composite.

2. Description of the Prior Art

Various types of photoelectric devices made of semiconductor materials have heretofore been proposed and put into practical use. One of typical such devices is a silicon photoelectric device, which is manufactured by forming a P-type (or N-type) diffused layer of a thickness of a few microns or less on the surface of an N-type (or P-type) silicon substrate so that when the light impinges on the P-N junction formed therebetween, photo voltaic energy is generated between the P-type layer and the N-type layer.

However, this conventional silicon photoelectric device is expensive as compared with other types of photoelectric devices, such as cadium sulfide photoelectric devices, mainly because manufacture of the silicon photoelectric devices, or silicon solar cells, necessitates a diffusion process which should be carried out at a high temperature and under a delicately controlled condition. On the other hand, in order to implement such a device having spectral sensitivity similar to the human visual sensitivity characteristic, it is essential to make the above mentioned diffused layer extremely thin, preferably as thin as 0.3 micron. Formation of such a thin diffused layer calls for a high level of diffusion technology techniques, inevitably resulting in a high cost of this type of device. Moreover, such conventional devices must have an electrode for taking the photo voltaic energy. This electrode must be formed on the abovementioned extremely thin diffused layer by a very complicated process, this being another reason for the high cost of this type of device.

The inability to make the diffused layer as thin as mentioned above results in insufficient sensitivity in a short wavelength region of spectral characteristic of this type of device and therefore limited the scope of application thereof.

If the diffused layer of such silicon photoelectric device could be replaced with a transparent conductive film of metal oxide and if such film could serve the same function as that of the diffused layer, the cost of producing a photoelectric device would ge greatly reduced and the resulting device would have a greater scope of application. As a result of the research aimed at development of such a device, the inventors of the present application succeeded in providing a semiconductor composite comprising a film of tin oxide $SnO_2$) deposited on a semiconductor substrate such as silicon and having rectifying and photoelectric characteristics therebetween.

More particularly, such a composite is obtained by a process comprising the steps of heating an N-type silicon single crystal substrate in a quartz tube, introducing the vapor of a tin salt such as dimethyl tin dichloride $(CH_3)_2SnCl_2$ into said quartz tube and having a tin oxide film deposited on said silicon substrate by pyrolysis. It was confirmed that between the tin oxide film and the silicon substrate of the composite thus obtained is formed a barrier which, being presumably a Schottky barrier, closely resembles a P-N junction in a rectifying characteristic. Such barrier may be advantageously utilized as a rectifying device or photoelectromotive force device.

As is well known, the tin oxide film is transparent and conductive. Hence, by so adapting the composite that light is applied to said barrier through the tin oxide film, a photoelectric device is provided. It has been observed that the spectral characteristic of such photoelectric device is such that it is more highly sensitive in the visible wavelength region as compared with a conventional silicon photoelectric device. It also exhibits a higher output at lower illumination, and has satisfactory in temperature characteristic and response characteristics.

The structure, characteristics, applications and manufacturing methods of the abovementioned $SnO_2$-semiconductor composite are described in more detail in the following Japanese patent applications filed by the same applicants of this application: "Photocell," filed Apr. 9, 1969, application No. 44-27545/1969; "Photoelectric Device and Method of Making," filed Aug. 7, 1969, application No. 44-62728/1969; "Method of Manufacturing Integrated Photoelectric Device," filed Aug. 7, 1969, application No. 44-62730/1969; "Method of Manufacturing Transparent Conductive Film," filed Aug. 7, 1969, application No. 44-62733/1969 "Method of Manufacturing Semiconductor Device," filed Sept. 24, 1969, application No. 44-76483/1969; "Semiconductor Photoelectric Device and Method of Making," filed Sept. 26, 1969, application No. 44-77192/1969; and "Method of Manufacturing Semiconductor Device," filed Oct. 2, 1969, application No. 44-79098/1969.

A problem in utilizing such $SnO_2$-semiconductor composite as a semiconductor device such as a rectifying device, photoelectric device, etc. is that when the composite wafer is scribed into chips or the $SnO_2$ film is provided with a lead wire by thermo-compression bonding over the electrode metal layer of nickel or the like the barrier formed between $SnO_2$ and semiconductor is badly damaged to affect the barrier characteristic of the resultant device. This damage makes it difficult to provide a semiconductor device of uniform response characteristics. Among others, the negative response characteristics of such semiconductor device is not necessarily satisfactory for a rectifying device.

Meanwhile, there occured a demand for integration of a plurality of such $SnO_2$-semiconductor elements in a single substrate, for instance, for development of a pattern recognition device.

The tin oxide film is chemically stable and resistant to chemical etching and this makes it difficult to deposit the tin oxide film accurately in the desired area on the semiconductor substrate, that is, accurately to etch the tin oxide film deposited all over the main surface of the substrate.

SUMMARY OF THE INVENTION

In short, the present invention provides a semiconductor composite comprising a film of electrically insulating material such as silicon dioxide formed on a portion of the main surface of a semiconductor substrate and a tin oxide film deposited on an area of said semiconductor substrate through an opening defined by said film of electrically insulating material, a barrier being formed between said semiconductor substrate and a tin oxide film in the area. The barrier thus formed is confined by said insulating film and is not exposed and hence a favorable rectifying characteristic thereof is ensured.

The semiconductor composite thus produced can be scribed into chips by scribing on said deposited insulating film. It was found that said barrier is not directly damaged by scribing and the rectifying characteristic is not affected. The composite chip can be provided with an electrode attached to the $SnO_2$ film and extending over said insulating film. This electrode attaching process does not affect said barrier.

This film of insulating material also protects the said barrier from being broken by the process of photo-etching of $SnO_2$ film when the abovementioned composite is utilized for fabrication of an integrated $SnO_2$-semiconductor composite device. More particularly, an integrated $SnO_2$-semiconductor composite is provided by photo-etching said $SnO_2$ film portion extending on said film of insulating material thereby dividing into a plurality of separate pieces, each piece thereof confined by said film of insulating material and forming a barrier in its boundary with the single semiconductor substrate. In such composite the $SnO_2$ film where the barrier is formed is not photo-etched and hence there is no risk of the barrier property deteriorating.

Thus, the film of insulating material contained in said semiconductor composite effectively prevents damage to the barrier and consequent deterioration of the characteristic caused by subsequent processing.

Therefore, it is an object of the present invention to provide a semiconductor composite device comprising a tin oxide film deposited on a semiconductor substrate and having a barrier of excellent characteristics therebetween.

Another object of the present invention is to provide a semiconductor device having a barrier of an excellent backward characteristic.

Still another object of the present invention is to provide a semiconductor device having a barrier of well stabilized characteristics and of high resistance to environments.

A further object of the present invention is to provide a semiconductor device in which the said barrier is formed in an area precisely defined.

Still a further object of the present invention is to provide an integrated semiconductor device in which said barrier is formed in a plurality of areas precisely defined on a main surface of a semiconductor substrate.

Yet a further object of the present invention is to provide good processes for accomplishing the objects enumerated above.

A basic feature of the semiconductor devices in accordance with the present invention is that the barrier between said semiconductor substrate and said tin oxide film is formed in an area confined by a film of insulating material such as silicon dioxide.

A feature of the manufacturing processes in accordance with the present invention is that said tin oxide film undergoes such processings as cutting, partial removal, etc. on said film of insulating material.

Other objects and features of the present invention will become apparent from the following detailed description of the preferred embodiments taken in conjunction with the accompanying drawings.

DESCRIPTION OF THE PREFERRED EMBODIMENTS

Figure 1:
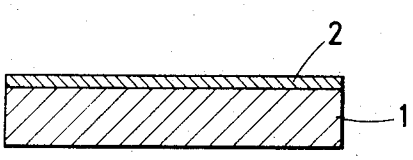
FIG. 1 is a sectional view of a semiconductor composite constituting the basis of the present invention.

Referring now to FIG. 1, there is shown a sectional view of a semiconductor composite constituting the basis of the present invention. This composite comprises, for example, an N-type silicon substrate 1 whose resistivity is about 1 ohm, and a tin oxide ($SnO_2$) film deposited on the upper surface thereof through pyrolysis of a tin salt such as dimethyl tin dichloride. The $SnO_2$ film 2 contained in the composite in accordance with the present invention shall be so selected that it exhibits high conductivity and itself constitutes an N-type semiconductor. Such conductivity shall be close to that of a metal or about $10^{20}$ atoms/cm$^3$ in terms of free electron concentration. The $SnO_2$ layer, having the properties of a N-type semiconductor, can be formed by a rapid chemical reaction yielding $SnO_2$. This result is presumably accounted for by the excess of metal (shortage of oxygen) resulting from the rapidity of such reaction.

It was discovered that the composite of such structure and composition has a rectifying characteristic and also exhibits a photoelectric effect when radiation energy is applied to the heterojunction formed inside such composite. One of the possible interpretations of the discovery is that, $SnO_2$ regarded as metal, this heterojunction behaves as a Schottkey barrier formed between $SnO_2$ film and the semiconductor substrate.

Figure 2:
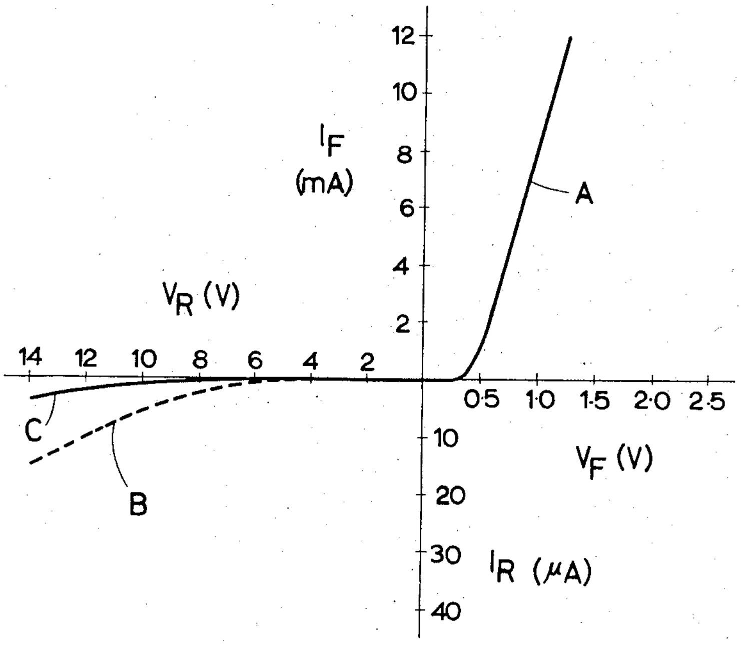
FIG. 2 is a graph showing the rectifying characteristic of the composite of FIG. 1, FIGS. 3 – 7 are sectional views of the semiconductor composite at several stages of the process of manufacture in accordance with the present invention.

Referring to FIG. 2, there is shown the rectifying characteristic of the semiconductor composite of FIG. 1. In the graph, Curve A shows a positive characteristic of such composite, while Curve B shows a negative characteristic of the composite chip obtained by scribing such composite by a known method.

Referring now to FIGS. 3–7, there are shown sectional views of a semiconductor device at several stages of manufacturing process in accordance with the present invention.

Figure 3:
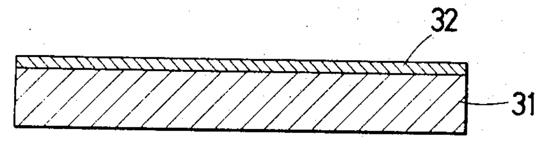

Referring to FIG. 3, there is formed a film of insulating material 32 such as of $SiO_2$ on a main surface of an N-type silicon single crystal substrate 31 with specific resistance of about 1 ohm to thickness of 8,000 A. Said semiconductor substrate 31 can either be a combination of an N-type layer of high specific resistance deposited on another N-type layer of low specific resistance or an N-type layer deposited all over or partially on a P-type layer. Said $SiO_2$ film 32 can be formed by either a known method of thermal reaction or pyrolysis of silane at a relatively low temperature. Such method of forming an electrically insulating film is well known to those skilled in the art.

Film of any other insulating material can be used in place of said $SiO_2$ film. Other such insulating materials are for example, silicon nitride ($Si_3N_4$), lead glass ($SiO_2$—PbO), and alumina glass ($SiO_2$—$Al_2O_3$). The insulating film 32 is preferably formed at a relatively low temperature, preferably at a temperature not exceeding about 900°C. Heating at an extremely high temperature calls for a more expensive apparatus, but such high temperatures increase the risk of damage to the semiconductor substrate.

A preferred method comprise formation of a $SiO_2$ layer through pyrolysis of silane at a relatively low temperature below 700°C and then reacting PbO therewith for formation of a layer of lead glass. By using such an insulating film, it is possible to completely manufacture a semiconductor device at a relatively low temperature below.

Figure 4:
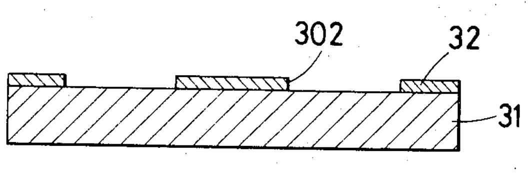

Then, as shown in FIG. 4, a part of the insulating film 32 is removed by photo-etching in a circular form, for example, providing an opening 302. It is also possible to have the insulating film 32 deposited in such a manner that such opening 302 is formed already at this stage. However, by first forming an insulating film of uniform thickness all over the main surface of the substrate and then removing the unnecessary part by the photo-etching method, the desired pattern with higher precision can be obtained. Films of $SiO_2$, $SiO_2$—PbO etc. can be processed by the photo-etching method with a high degree of precision.

Figure 5:
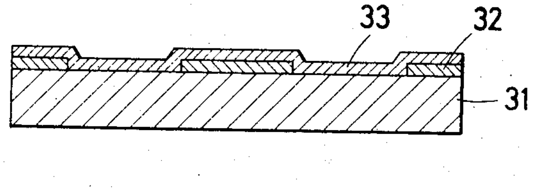

At the next stage, as shown in FIG. 5, a tin oxide film 33 is formed all over the main surface containing the insulating film 32 to provide a semiconductor composite. This is accomplished by first heating the semiconductor substrate 31 to about 500°C in a quartz reaction tube and then introducing a vapor containing tin into said reaction tube to have a tin oxide film 33 deposited by pyrolysis on the substrate 31. For this reaction, dimethyl tin dichloride ($(CH_3)SnCl_2$) can be used. This compound was found to be most preferable. It is, however, also possible to use an aqueous solution of tin tetrachloride ($SnCl_4$) or its solution in an organic solvent.

As carrier gas an oxydizing atmosphere such as air, oxygen can be used. The tin oxide film 33 can be deposited to a thickness of about 7,000 A by conducting said pyrolytic reaction for 60 sec. For improving the conductivity of the film 33 said reaction source material was admixed with about 0.5 wt. percent of antimony oxide ($Sb_2O_3$).

It was discovered that an N-type silicon semiconductor is

Electrodes suitable material for the substrate of said composite. However, a semiconductor composite of the like rectifying characteristic was also able to be implemented with the use of P-type silicon semiconductor. In using P-type material, however, it was found to be preferable to carry out the $SnO_2$ deposition reaction at a somewhat higher temperature or to give a proper heat treatment to the composite made by $SnO_2$ deposition at the reaction temperature mentioned above. It was further discovered that composites of a similar rectifying characteristic was also able to be manufactured with Ge or GaAs as a substrate material.

Figure 6:
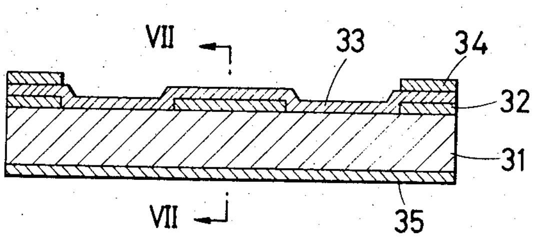

Electrodes 34 and 35 are then formed on both main surfaces of the substrate as shown in FIG. 6. These electrodes 34 and 35 are formed by depositing nickel by a vacuum evaporation method to a thickness of about 8,000 A. As will be apparent from FIG. 6, electrode 34 occupies the area where the electrode is to be eventually formed selectively in the part of tin oxide film deposited on said insulating film 32. Electrode 34 is formed by first depositing nickel all over the main surface of the substrate 31 and then removing the unnecessary part by a known method of photo-etching. Electrode 35 can be dispensed with where the substrate 31 is attached to a gold-plated stem over a gold-silicon eutectic layer.

It was found that, as a material of the electrode to be formed in the tin oxide layer, nickel was one of the most preferred in view of its conductivity, adhesion to the layer, cost and soldering possibility, etc. It is also possible to use silver, gold, chromium or aluminum instead, however. Especially, in case of an integrated composite, details of which will be described afterward with reference to FIGS. 8A and 8B, the electrode for $SnO_2$ has but a small area of contact and is subject to peeling. Hence, the electrode for such integrated composites are preferably of a three layer construction comprising a Ti film deposited on the $SnO_2$ film, the first metal layer deposited thereon and the second metal layer deposited on the first metal layer. Preferred materials for the first metal layer are Cu or Ag. Au, Ni or Al is preferred as a material for the second metal layer.

The electrode for Si substrate can be an eutectic crystal of Au or Au—Sb with Si. For eutectic crystallization, however, a temperature of about 390° is required which temperature can cause deterioration of the rectifying characteristic of the $SnO_2$—Si composite. A preferred alternative electrode is of two layer construction comprising a Ti layer deposited on the substrate and a Ni layer deposited on the Ti layer. The electrode of this construction can be formed with a processing temperature of about 200°C, which does not cause deterioration of the rectifying characteristic of the composite, and yet it brings about an improved ohmic contact.

Figure 7:
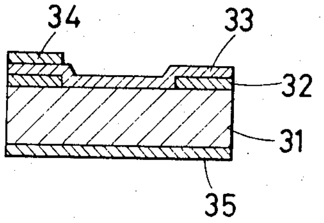

Then, as shown in FIG. 6, the substrate is divided by a proper method such as scribing along the line VII—VII into semiconductor composite chips as shown in FIG. 7. Since the part through which runs the line VII—VII comprises an insulating layer 32 or silicon dioxide or the like between the substrate 31 and the tin oxide film 33, the dividing operation by a known method of scribing with a diamond cutter or the like and subsequent bending has no adverse effect on the barrier characteristic of the composite. In other words, the presence of said insulating layer underneath the tin oxide film perfectly avoids the damage of the barrier caused by the dividing operation.

Now referring again to FIG. 2, the curve C shows the negative characteristics of the semiconductor composite chip shown in FIG. 7. As this curve shows, the barrier formed within the area confined by the insulating film and thus protected in its rim has a better stabilized rectifying characteristic and permits less negative current than a prior art composite having a barrier with its rim exposed.

Since the electrode 34 is formed outside the area in which the barrier is formed, the entire barrier formed in the chip is effectively utilized in case it is used as a photoelectric device. Pressure applied to the electrode 34 in attaching a lead wire thereto does not affect the rectifying characteristic. No barrier is formed underneath the electrode, which is deposited on a portion of $SnO_2$ film 33 above the silicon dioxide film. Another advantage of said barrier is that it is stable under the influence of outside atmosphere for a long time.

Figure 8A:
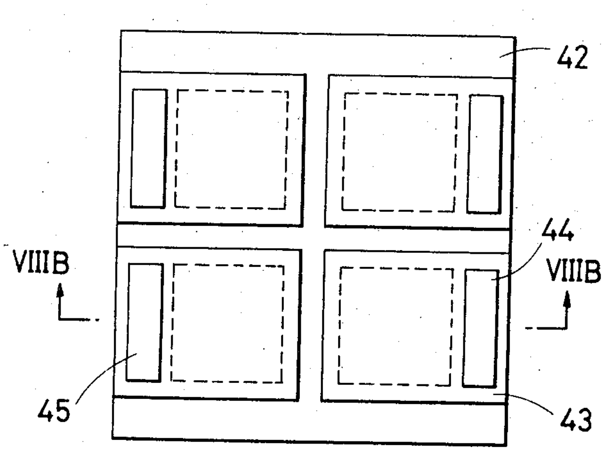
FIG. 8A is a top view of a semiconductor device in accordance with another embodiment of the present invention.
Figure 8B:
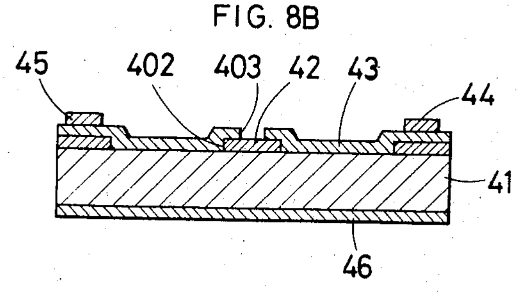
FIG. 8B is a sectional view of the device of FIG. 8A taken long the line VIIB—VIIB.

FIGS. 8A and 8B illustrate a semiconductor device of another embodiment in accordance with the present invention, in this embodiment, an N-type silicon substrate 41 has a silicon dioxide film 42 deposited thereon with an opening 402, a tin oxide film 43 deposited on the substrate 41 where it is exposed through the opening 402 and nickel electrodes 44 and 46. The silicon dioxide film 42 is first formed all over on a main surface of silicon substrate 41 and then portions thereof are removed to form the openings 402 which provide a plurality of exposed areas of said main surface of the substrate which are isolated from one another. The tin oxide film 43 is then formed all over on said main surface including where said silicon dioxide film 42 is formed and hence the barrier is formed between the substrate 41 and the tin oxide film 43 only in said plurality of opening areas precisely confined by said silicon dioxide film 42.

The tin oxide film 43 is partially removed just at a portion where it is deposited on silicon dioxide film 42. These removed portions form separating portions 403 which divide the composite into a plurality of barrier regions. A photo-etching technique can be effectively utilized for dividing the tin oxide film 43 into a plurality of sections. The tin oxide, chemically stable as it is, is difficult to etch away. However, its etching can be accomplished with a relatively high precision by the process of first depositing zinc where the film is to be removed by etching, dissolving it away with a dilute solution of hydrochloric acid for slight reduction of the surface of the tin oxide film, depositing zinc again and then dissolving it away with concentrated hydrochloric acid together with tin oxide underneath.

In view of the fact that the regions where the barrier is formed are precisely confined by a film of insulating material such as silicon dioxide and are well protected, this process of photo-etching of tin oxide film on the insulating layer does not call for a high degree of precision and even application of mechanical force for removal of tin oxide film is permissable to some extent. Therefore, it is also possible to divide said tin oxide film 43 into a plurality of sections by scribing instead of etching, this being much more efficient and simpler.

In case Ni is used as a material of the electrode for the $SnO_2$ layer, for example, in the manufacture of semiconductor devices as shown in FIG. 7 and FIG. 8B, the following consideration must be given. Normally, in order to provide electrodes of desired pattern, Ni is deposited all over on the $SnO_2$ film on the wafer and then unnecessary portions of the deposited Ni are removed by photo-etching to leave electrodes of the desired pattern. A solution of ferric chloride is used as the etching solution. In this connection, it was found that the Ni etching speed is the barrier region, i.e., the region of $SnO_2$—Si construction, is five to six times higher than that in $SiO_2$ film region, i.e., the region of $ShO_2$—$SiO_2$ construction. Therefore, it is considered advantageous first to etch away the unnecessary portions of Ni film in the regions of $SnO_2$—$SiO_2$ construction and then repeat the procedure for removal of the unnecessary portions of Ni film in the regions of $SnO_2$—Si construction.

More particularly, Ni film is first deposited all over on the $SnO_2$ film formed on the substrate and this Ni film is masked in the first pattern covering the regions where the electrodes are to be formed and the regions of $SnO_2$—Si construction. Ni film in the unmasked area is removed by etching. Subsequently another masking is performed in the second pattern covering at least the regions where the electrodes are to be formed and Ni film in the unmasked area is removed by etching. Then, the mask on Ni film of the desired pattern is removed. In this process, one edge of the formed Ni film electrode, i.e., the edge of the side of $SnO_2$—Si construction is subjected only to the second etching, i.e., etched only once, whereas the other edge, i.e., the edge on the side of $SnO_2$—$SiO_2$ construction is subjected to both the first and second etching, i.e., etched twice. This results in an excessive etching of the edge of Ni electrode on the side of $SnO_2$—$SiO_2$ construction. Hence, it is advisable to take this into due consideration in determining the patterns of the first and second masks for having said excessive etching compensated for.

As will be apparent from the rectifying characteristic shown in FIG. 2, the devices in accordance with the present invention exhibit favorable rectifying characteristic curves and hence can be useful as a rectifying device. As is well know, however, tin oxide film is transparent and hence, when said barrier can be unnecessarily exposed to light through the tin oxide film and the resultant generation of electromotive force is bound to affect the stability of the rectifying characteristic of the device. The inventive element, therefore, would provide a favorable rectifying device, if the above defect could be eliminated.

Figure 9:
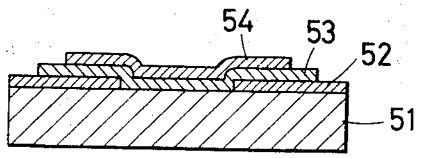
FIG. 9 is a sectional view of a semiconductor in accordance with still another embodiment of the present invention.

FIG. 9 is a sectional view of a semiconductor device in accordance with another embodiment of the present invention constructed to be suitable for use as a rectifying device. The device of FIG. 9 comprises an N-type silicon substrate 51, a film of insulating material such as silicon dioxide 52, a tin oxide film 53 and electrode metal layer of e.g., nickel 54. The device of FIG. 9, unlike that of FIG. 7, has its barrier region and its rims covered with an opaque electrode metal layer 54, this metal layer 54 screening the barrier from light. As such an opaque material it is preferred to use the electrode metal layer in view of the characteristic (forward resistance diminished) or manufacturing technique. It is also possible to use other opaque insulating materials such as opaque resin, however.

When the electrode metal layer is utilized for this purpose, it is preferred to make the tin oxide film as thin as possible, preferably 2,000 – 5,000 A. It is also preferred to use as the semiconductor substrate a combination of a layer of low specific resistance with a layer of high specific resistance thereon.

In the foregoing was described only the construction of a simple rectifying device. But the present invention can also be applied to construction of other elements such as fabricated by integration with transistors, for example.

While specific preferred embodiments of the invention have been described it will be apparent that obvious variations and modifications of the invention will occur to those ordinary skill in the art from a consideration of the foregoing description. It is therefore desired that the present invention be limited only by the appended claims.

What is claimed is:

1. A semiconductor photoelectric device comprising a semiconductor substrate having a main surface, a film of insulating material selected from a group consisting of $SiO_2$, $Si_3N_4$, $SiO_2$—$Al_2O_3$, and $SiO_2$—PbO, formed on a portion of the main surface of said substrate, a transparent tin oxide film deposited on the surface of said substrate defined by said film of insulating material and on said film of insulating material, whereby a barrier having a rectifying characteristic is formed between said substrate and said tin oxide film, a metal electrode deposited on an area of said tin oxide film which is formed on said film of insulating material, and means for withdrawing a photoelectric conversion output.

2. The semiconductor composite according to claim 1 in which said semiconductor substrate is selected from the group consisting of Si, Ge and GaAs.

3. The semiconductor composite according to claim 1 in which said metal electrode is Ni.

4. A semiconductor composite according to claim 1 in which said metal electrode comprises a Ti layer deposited on the tin oxide film, a first metal layer deposited on the Ti layer and a second metal layer deposited on the first metal layer.

5. The semiconductor composite according to claim 4 in which said first metal layer is selected from the group consisting of Cu and Ag and said second metal layer is selected from the group consisting of Au, Ni and Al.

6. A semiconductor composite according to claim 1 in which said film of insulating material defines closed areas wherein said substrate is exposed, and said tin oxide is formed in said closed areas and on said insulating film, whereby a plurality of barriers having a rectifying characteristic are formed, and said tin oxide film is divided on an area of said film of insulating material to form a plurality of semiconductor elements in which individual barriers have independent rectifying characteristics.

7. A semiconductor composite according to claim 1 in which an opaque material is placed on said tin oxide film to screen at least said barrier regions.

8. The semiconductor device according to claim 7 in which said opaque material is conductive and constitutes the electrode metal.

9. The semiconductor composite according to claim 1, in which said film of insulating material consists of silicon dioxide.

* * * * *